(12) United States Patent
Adachi et al.

(10) Patent No.: US 7,508,495 B2
(45) Date of Patent: Mar. 24, 2009

(54) POSITIONING STAGE, BUMP FORMING APPARATUS EQUIPPED WITH THE POSITIONING STAGE, AND BUMP FORMING METHOD PERFORMED USING THE POSITIONING STAGE

(75) Inventors: Naoya Adachi, Yasu (JP); Masayuki Sumita, Konann (JP); Masaki Sekino, Hakusan (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 11/942,320

(22) Filed: Nov. 19, 2007

(65) Prior Publication Data
US 2008/0068581 A1  Mar. 20, 2008

Related U.S. Application Data

(63) Continuation of application No. PCT/JP2006/30960, filed on May 12, 2006.

(30) Foreign Application Priority Data
May 18, 2005  (JP) .............................. 2005-145259

(51) Int. Cl.
*G03B 27/58* (2006.01)
*G03B 27/62* (2006.01)
(52) U.S. Cl. .......................................... 355/72; 355/75
(58) Field of Classification Search ................. 355/53, 355/72–76; 361/234
See application file for complete search history.

(56) References Cited

U.S. PATENT DOCUMENTS

| 6,172,738 | B1 * | 1/2001 | Korenaga et al. ............. 355/53 |
| 6,806,943 | B2 * | 10/2004 | Barringer et al. ............. 355/75 |
| 2002/0064450 | A1 | 5/2002 | Coomer et al. |
| 2002/0105277 | A1 | 8/2002 | Tomita et al. |

(Continued)

FOREIGN PATENT DOCUMENTS

JP    60-167245    8/1985

(Continued)

OTHER PUBLICATIONS

International Search Report issued Jul. 18, 2006 and the English language translation.

(Continued)

*Primary Examiner*—Hung Henry Nguyen
(74) *Attorney, Agent, or Firm*—Ostrolenk, Faber, Gerb & Soffen, LLP (57) ABSTRACT

A positioning stage that can prevent an excessive force from being imparted to a positioned wafer, a bump forming apparatus equipped with such a positioning stage, and a bump forming method performed using such a positioning stage are provided. A biasing member that biases a wafer towards a positioning member has a contact surface that substantially faces a wafer-holding surface at an angle. The contact surface is in contact with an outer peripheral area of the wafer so as to bias the wafer slantwise towards the wafer-holding surface. With a resiliently deformable member, the positioning member is brought into contact with the wafer and is held at a predetermined position. When a bias force exceeding a predetermined magnitude is imparted to the positioning member, the resiliently deformable member becomes resiliently deformed so as to allow the positioning member to recede from the predetermined position.

15 Claims, 9 Drawing Sheets

U.S. PATENT DOCUMENTS

2003/0217811 A1    11/2003    Jeong

FOREIGN PATENT DOCUMENTS

| JP | 4-110466 |   | 4/1992 |
| --- | --- | --- | --- |
| JP | 5-109871 |   | 4/1993 |
| JP | 10-163214 | * | 6/1998 |
| JP | 2001-210664 |   | 8/2001 |
| JP | 2003-92331 |   | 3/2003 |

OTHER PUBLICATIONS

Written Opinion issued Jul. 18, 2006 and the English language translation.

Supplementary European Search Report issued Aug. 12, 2008.

Supplementary European Search Report issued Aug. 2008 in connection with the corresponding European Application No. 06746350.5 (All of the references were previously cited in an IDS dated Nov. 19, 2007 or Sep. 11, 2008 and are therefore not enclosed.).

* cited by examiner

POSITIONING STAGE, BUMP FORMING APPARATUS EQUIPPED WITH THE POSITIONING STAGE, AND BUMP FORMING METHOD PERFORMED USING THE POSITIONING STAGE

CROSS-REFERENCE TO RELATED APPLICATIONS

This is a continuation under 35 U.S.C. §111(a) of PCT/JP2006/309603 filed May 12, 2006, and claims priority of JP2005-145259 filed May 18, 2005, incorporated by reference.

BACKGROUND

1. Technical Field

The present invention relates to a positioning stage, a bump forming apparatus equipped with such a positioning stage, and a bump forming method performed using such a positioning stage.

2. Background Art

In manufacturing processes of electronic components, positioning stages for the positioning of wafers are generally used.

Figures 1A, 1B:
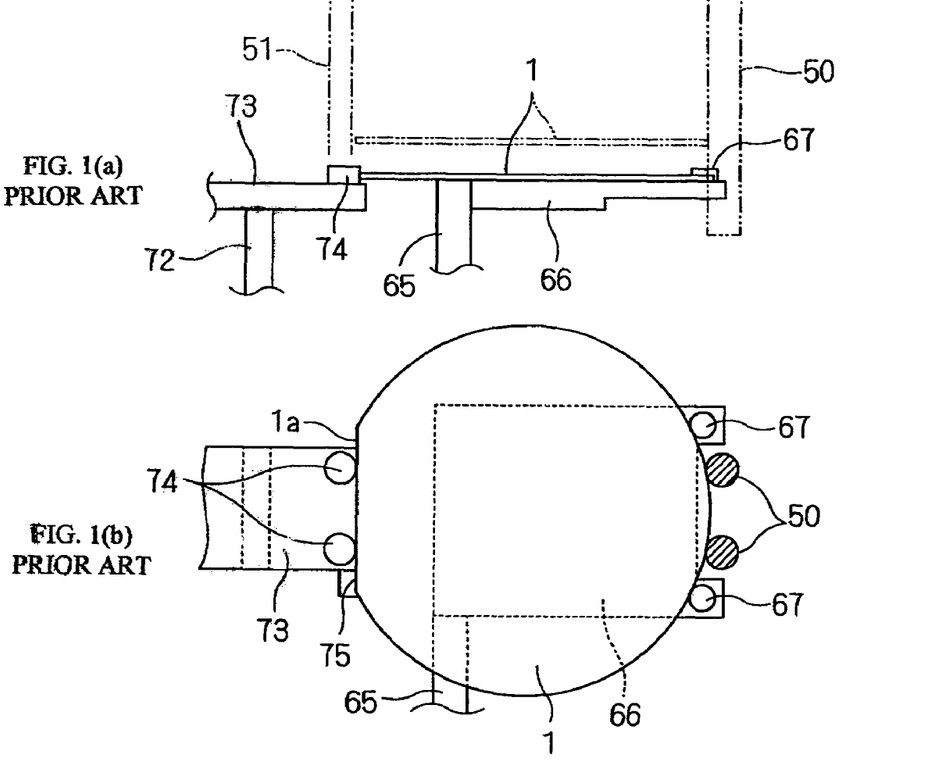
FIGS. 1(a) and 1(b) illustrate a positioning mechanism for a wafer (related art).

For example, referring to FIGS. 1(a) and 1(b), a wafer receiver 66 provided on an end of a supporting arm 65 supports a wafer 1. In a state where positioning rollers 67 are located outside the outer periphery of the wafer 1, a stopper arm 72 is moved with respect to the supporting arm 65. Using a bias force of a spring, the positioning rollers 67 and stopper rollers 74 sandwich the wafer 1 therebetween with an appropriate load (for example, see Patent Document 1).

Figure 2:
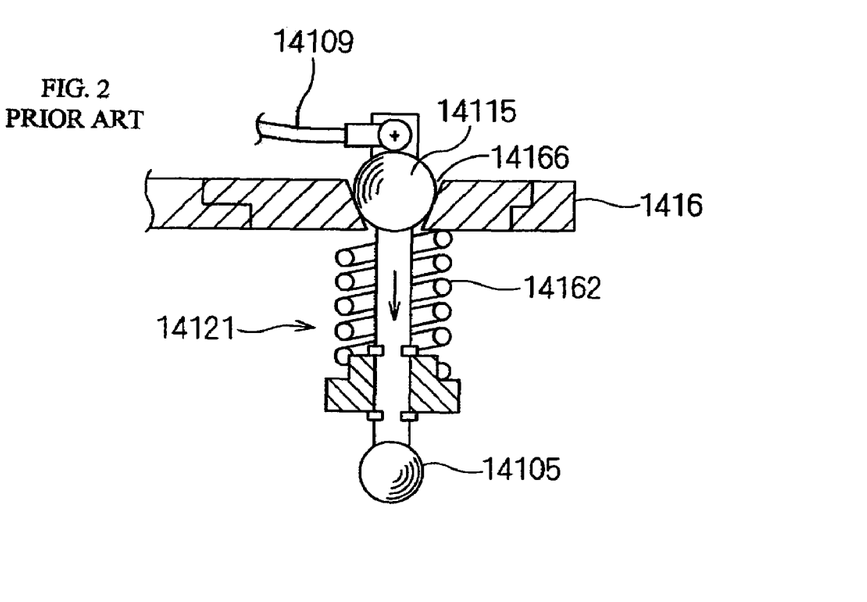
FIG. 2 illustrates a charge-removing mechanism (related art).

In a case where a temperature change induces an electric charge, as in a piezoelectric substrate having pyroelectric properties, it is necessary to bring a charge-removing contact member into contact with a wafer placed on a positioning stage of a bump forming apparatus in order to remove the electric charge from the wafer. For example, referring to FIG. 2, a charge-removing member 1416 is provided with a cone-shaped hole 14166, and a ball 14115 provided at one end of a charge-removing contact member 14121 has a ground wire 14109 attached thereto. The other end of the charge-removing contact member 14121 is provided with a ball 14105 which is biased with a spring 14162. The charge-removing contact member 14121 is brought into contact with a surface of a wafer so as to ground the electrically charged surface (for example, see Patent Document 2).

Patent Document 1: Japanese Unexamined Patent Application Publication No. 10-163214 (FIG. 11)

Patent Document 2: Japanese Unexamined Patent Application Publication No. 2001-210664 (FIG. 20)

Moreover, when a wafer placed and positioned on a stage is heated in the course of a bump forming process, there are cases where the wafer gets damaged. This can occur when the heated wafer held in position undergoes thermal expansion, causing the internal stress generated within the wafer to exceed its strength.

In the case where a temperature change induces an electric charge on a wafer, if the positioning and charge-removing steps for the wafer are to be performed separately, the overall process and the equipment therefor will be complicated. This makes it difficult to achieve higher production efficiency.

SUMMARY

In view of the circumstances described above, it would be desirable to use a positioning stage that prevents a wafer held in position from receiving an excessive force, and also provides a bump forming apparatus equipped with such a positioning stage and a bump forming method performed using such a positioning stage.

In order to achieve the aforementioned advantages, it is proposed to use a positioning stage as described below.

A positioning stage includes a wafer-holding surface on which a wafer is placed; a positioning member that is disposed adjacent to the wafer placed on the wafer-holding surface and that extends substantially orthogonal to the wafer-holding surface; and a biasing member that is in contact with the wafer placed on the wafer-holding surface so as to resiliently bias the wafer towards the positioning member. The biasing member has a contact surface that substantially faces the wafer-holding surface at an angle, the contact surface being in contact with an outer periphery area of the wafer placed on the wafer-holding surface so as to bias the wafer slantwise towards the wafer-holding surface.

Accordingly, the contact surface of the biasing member biases the outer periphery area of the wafer placed on the wafer-holding surface substantially towards the positioning member. Since the contact surface is inclined with respect to the wafer-holding surface, the wafer receives a force component parallel to the wafer-holding surface, and a force component orthogonal to the wafer-holding surface and oriented towards the wafer-holding surface. With the latter force component, the wafer is pressed towards the wafer-holding surface. Thus, the wafer is prevented from floating upward from the wafer-holding surface while the wafer can be biased towards the positioning member. This prevents an excessive force from being imparted to the wafer, unlike a case where the biasing of a wafer towards a positioning member is implemented by only applying a force parallel to the wafer-holding surface onto the wafer.

It is preferable that the biasing member has electrical conductivity in at least the contact surface.

With this configuration, if the wafer is electrically charged, the contact surface of the biasing member having electrical conductivity may be brought into contact with the outer periphery area of the wafer so that the electric charge on the wafer can be removed through the contact surface of the biasing member.

The positioning stage has a resiliently deformable member that brings the positioning member into contact with the wafer placed on the wafer-holding surface and holds the positioning member at a predetermined position corresponding to where the wafer is to be positioned. When a bias force exceeding a predetermined magnitude is imparted to the positioning member in a direction substantially away from the wafer placed on the wafer-holding surface, the resiliently deformable member becomes resiliently deformed so as to allow the positioning member to recede from the predetermined position towards the direction substantially away from the wafer placed on the wafer-holding surface.

In this configuration, since the positioning member in contact with the wafer can recede from the positioning position by resilient deformation of the resiliently deformable member, the wafer can be prevented from receiving a force exceeding a predetermined magnitude from the positioning member. Accordingly, this prevents an excessive force from being imparted to the positioned wafer.

As a resiliently deformable member, a leaf spring or a bimetallic structure, for example, may be used. If a bimetallic structure is used, the resiliently deformable member becomes deformed voluntarily in response to a temperature change caused by heating of the positioning stage, thereby preliminarily preventing an occurrence of stress.

In addition, an advantageous bump forming apparatus is described below.

A bump forming apparatus includes two or more of the aforementioned positioning stages (which will simply be referred to as "stages" hereinafter); heating means for heating each of wafers placed on the wafer-holding surfaces of the stages; and stage shifting means for integrally shifting the stages between a bump forming position facing a bonding device and a withdrawn position withdrawn from the bump forming position. The stage shifting means sequentially shifts the stages to the bump forming position, and the bonding device forms a bump on a wafer placed on the wafer-holding surface of one of the stages positioned at the bump forming position; while a wafer having a bump formed thereon, placed on the wafer-holding surface of another stage positioned at the withdrawn position, is removed from the wafer-holding surface of said other stage. A subsequent wafer to have a bump formed thereon is placed on the wafer-holding surface of said other stage and is heated by the heating means.

In this configuration, the heating means may be provided inside of or outside of each of the stages.

In addition to preventing an excessive force from being imparted to the positioned wafers, the above configuration can readily contribute to higher production efficiency since a wafer detachment process and a wafer heating process can be performed at one stage while a bump forming process is simultaneously performed at another stage.

In addition, an advantageous bump forming method is described below.

A bump forming method is performed using two or more of the aforementioned positioning stages (which will simply be referred to as "stages" hereinafter) to sequentially form bumps on wafers placed on the wafer-holding surfaces of the stages. The bump forming method includes a first step for disposing at least one of the stages at a bump forming position facing a bonding device while disposing at least another one of the stages at a withdrawn position withdrawn from the bump forming position; a second step for disposing the at least one of the stages at the withdrawn position while disposing the at least another one of the stages at the bump forming position; and repeating the first step and the second step while integrally shifting the stages. The first and second steps include allowing the bonding device to form a bump on a wafer placed on the wafer-holding surface of the stage disposed at the bonding position, and removing a wafer having a bump formed thereon from the wafer-holding surface of the stage disposed at the withdrawn position, and placing a subsequent wafer to have a bump formed thereon on the wafer-holding surface of the stage and heating the wafer.

In addition to preventing an excessive force from being imparted to the positioned wafers, the above method can readily contribute to higher production efficiency since a wafer detachment process and a wafer heating process can be performed at one stage while a bump forming process is simultaneously performed at another stage.

The positioning stage, the bump forming apparatus equipped with the positioning stage, and the bump forming method performed using the positioning stage according to the present invention prevent an excessive force from being imparted to a positioned wafer.

Other features and advantages of the disclosed apparatus and method will become apparent from the following description of embodiments thereof which refers to the accompanying drawings.

REFERENCE NUMERALS 2 wafer
10 bump forming apparatus
20 stage shifting device (stage shifting means)
21, 22 heat stage (positioning stage)
24 stage body
24a upper surface (wafer-holding surface)
26 clamp arm (biasing member)
26s contact surface
27 leaf spring (resiliently deformable member)
28 positioning pin (positioning member)

DETAILED DESCRIPTION

Embodiments of the disclosed apparatus and method will now be described with reference to FIGS. 3 to 11.

Figure 3:
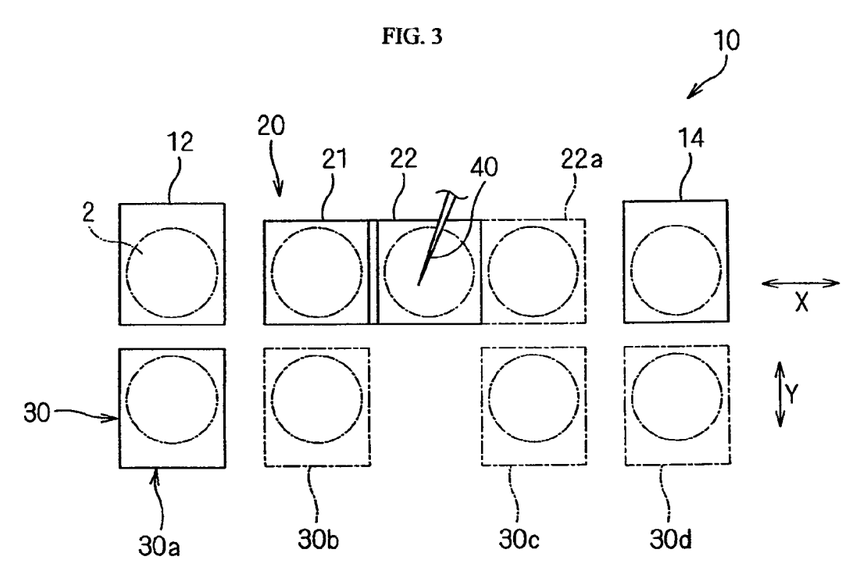
FIG. 3 is a schematic plan view of a bump forming apparatus (embodiment).

As shown in a plan view of FIG. 3, a bump forming apparatus 10 forms bumps alternately on wafers 2 placed on two heat stages 21 and 22.

Each wafer 2 is composed of a piezoelectric material having pyroelectric properties, such as lithium tantalate ($LiTaO_3$) or lithium niobate ($LiNbO_3$), used for forming, for example, a surface-acoustic-wave (SAW) filter. The wafer 2 has a ground electrode on an outer periphery area thereof.

In the apparatus shown in FIG. 3, the two heat stages 21 and 22 are shifted integrally in the left-right direction (X direction) with a stage shifting device 20 so that the heat stages 21 and 22 are alternately disposed at a bump forming position located directly below a bonding head 40 of a bonding device. When each of the heat stages 21 and 22 is disposed at the bump forming position, the bonding head 40 forms a bump on the wafer 2 placed on the heat stage. A wafer feeder magazine 12 and a wafer storage magazine 14 are disposed at opposite sides of the stage shifting device 20.

Figure 4:
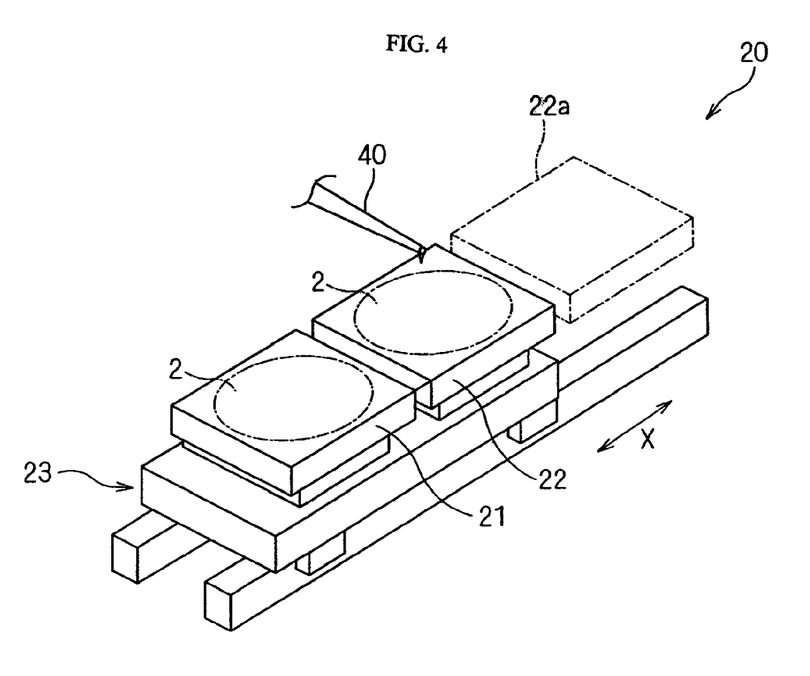
FIG. 4 illustrates a stage shifting device (embodiment).

Referring to FIG. 4, the stage shifting device 20 has a single shiftable table 23 that is shiftable in the left-right direction (X direction). The shiftable table 23 has the heat stages 21 and 22 fixed thereon and is driven by an actuator, such as a motor (not shown), so as to be shifted between left and right positions. The heat stages 21 and 22 move integrally with the shifting of the shiftable table 23.

When the shiftable table 23 is positioned at the left side in the drawing, the heat stages 21 and 22 are disposed such that the heat stage 22 on the right is set at the bump forming position located directly below the bonding head 40, as shown with a solid line. On the other hand, the heat stage 21 on the left is set at a position free of the bump forming position, namely, at a withdrawn position.

When the shiftable table 23 is positioned at the right side in the drawing, the heat stage 21 on the left is set at the bump forming position located directly below the bonding head 40. On the other hand, the heat stage 22 on the right is set at a position free of the bump forming position, namely, at a withdrawn position, as shown with a chain line 22a.

Each of the heat stages 21 and 22 contains a heater (not shown) that heats the wafer 2 placed thereon to a predetermined temperature before a bump forming process is performed on the wafer 2.

Referring to FIG. 3, each wafer 2 is conveyed by the stage shifting device 20 and a transferring device 30 that moves along the wafer magazines 12 and 14.

At a position facing the wafer magazine 12 indicated with a reference numeral 30a and a position facing the wafer magazine 14 indicated with a reference numeral 30d, the transferring device 30 transfers and extracts wafers 2 to and from the wafer magazines 12 and 14 using an arm 32 to be described hereinafter (see FIGS. 6 to 9) that moves back and forth in a front-back direction (Y direction).

When the shiftable table 23, that is, the heat stages 21 and 22, is positioned at the left side as indicated with a solid line, the transferring device 30 is set at a position indicated with a reference numeral 30b that faces the left heat stage 21 disposed at the withdrawn position so as to transfer or extract a wafer 2 to or from the heat stage 21. When the shiftable table 23, that is, the heat stages 21 and 22, is positioned at the right side, the transferring device 30 is set at a position indicated with a reference numeral 30c that faces the right heat stage 22 disposed at the withdrawn position so as to transfer or extract a wafer 2 to or from the heat stage 22.

Based on the above operation, the transferring device 30 transfers wafers 2 from the wafer feeder magazine 12 to the stages 21 and 22 or transfers wafers 2 from the stages 21 and 22 to the wafer storage magazine 14 at different periods.

An overall operation for forming bumps on wafers 2 using the bump forming apparatus 10 will now be described with reference to FIG. 5.

Figure 5A:
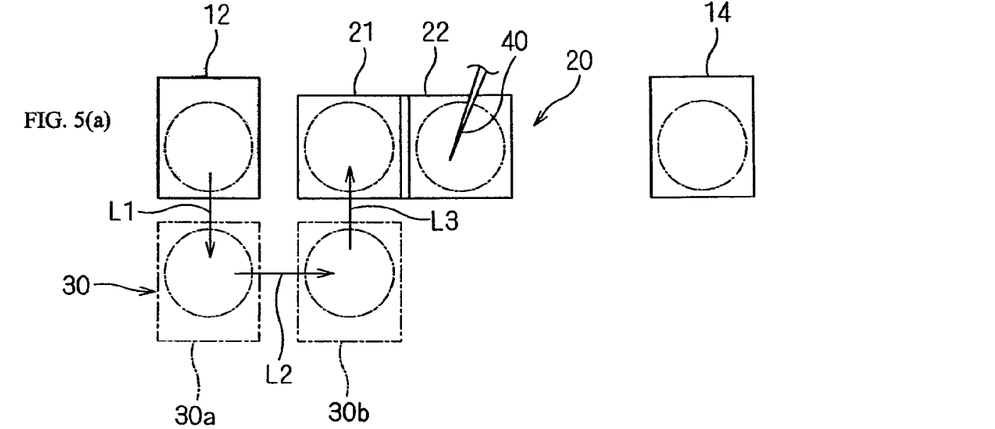
FIGS. 5(a)-5(c) illustrate an operation performed by the bump forming apparatus (embodiment).

Referring to FIG. 5(a), when the heat stages 21 and 22 are shifted to the left with the stage shifting device 20, the transferring device 30 at the position 30a facing the wafer feeder magazine 12 extracts a single wafer 2 from a plurality of wafers 2 packed horizontally in the wafer feeder magazine 12, as shown with an arrow L1. Subsequently, as shown with an arrow L2, the transferring device 30 transfers the wafer 2 to the position 30b facing the left heat stage 21. Then, the transferring device 30 places the wafer 2 on the left heat stage 21, as shown with an arrow L3, and positions the wafer 2 at a predetermined position. The wafer 2 placed on the left heat stage 21 is heated to a predetermined temperature (110° to 130° C.).

Subsequently, referring to FIG. 5(b), the heat stages 21 and 22 are shifted integrally to the right with the stage shifting device 20 so that the wafer 2 placed on the left heat stage 21 and preheated to the predetermined temperature (110° to 130° C.) is disposed at the bump forming position located directly below the bonding head 40 of the bonding device. At the bump forming position, the bonding head 40 forms a bump on the wafer 2.

Specifically, based on a correction between graphic coordinates on the wafer 2 and coordinates on an X-Y table of the bonding head 40 performed using an image recognition device and a reference mark provided on the wafer 2, the bonding head 40 uses an Au wire to form an Au ball on the wafer 2 heated to the predetermined temperature (110° to 130° C.). The ball formed is bump-bonded (metallic-bonded) to an Al electrode of the wafer 2 by utilizing both the heat of the heat stage 21 at the predetermined temperature and ultrasonic vibration. This bump forming process is performed over the entire wafer 2.

In the meantime, the transferring device 30 moves to the position 30c facing the right heat stage 22 and extracts a wafer 2 having a bump formed thereon from the right heat stage 22, as shown with an arrow R4. Subsequently, the wafer 2 having the bump is transferred to the position 30d facing the wafer storage magazine 14, as shown with an arrow R5, and is then stored in the wafer storage magazine 14, as shown with an arrow R6. Next, the transferring device 30 extracts a wafer 2 from the wafer feeder magazine 12 at the position 30a facing the wafer feeder magazine 12, as shown with an arrow R1. Then, the wafer 2 is transferred to the position 30c facing the right heat stage 22, as shown with an arrow R2. Subsequently, the wafer 2 is placed on the right heat stage 22, as shown with an arrow R3. The wafer 2 placed on the heat stage 22 is heated to a predetermined temperature.

Figure 5B:
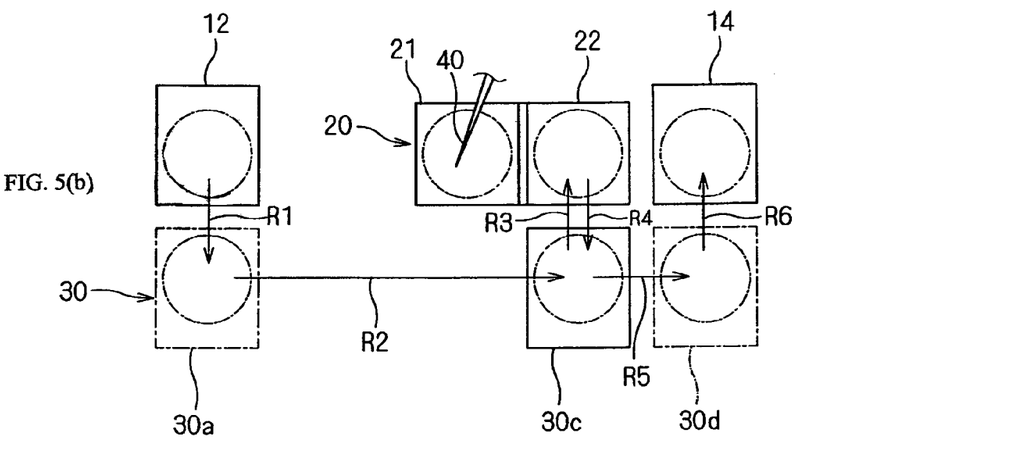
Figure 5C:
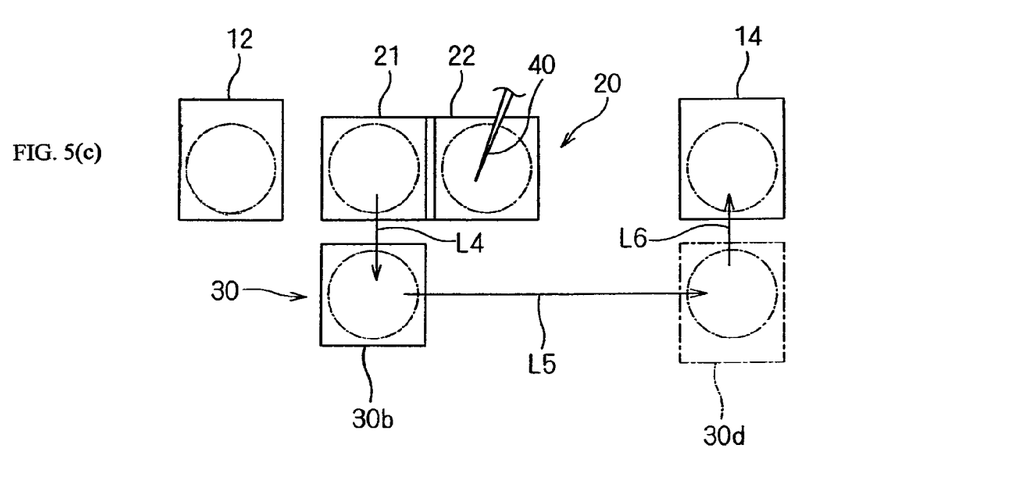

When the bump forming process performed on the entire wafer 2 placed on the left heat stage 21 is completed, the heat stages 21 and 22 are shifted integrally to the left with the stage shifting device 20, as shown in FIG. 5(c). The left heat stage 21 blows out air through air holes 24t of a stage body 24 to be described hereinafter (see FIG. 10) so as to allow the temperature of the wafer 2 placed thereon to decrease to a predetermined temperature (70° to 90° C.). When the temperature of the wafer 2 reaches a predetermined value (for example, 80° C.), clamp arms 26 (see FIGS. 6(a) to 10) open so that the wafer 2 can be transferred to the wafer storage magazine 14. In other words, the transferring device 30 moves to the position 30b facing the left heat stage 21 and extracts the wafer 2 with the bump formed thereon from the left heat stage 21, as shown with an arrow L4. The wafer 2 having the bump is then transferred to the position 30d facing the wafer storage magazine 14, as shown with an arrow L5. Subsequently, as shown with an arrow L6, the wafer 2 is stored in the wafer storage magazine 14 in a horizontally packed manner.

In the meantime, the bonding head 40 of the bonding device performs a bump forming process on the wafer 2 placed on the right heat stage 22.

By alternately using the heat stages 21 and 22 in synchronization with the shifting of the heat stages 21 and 22, the same processes are performed at different periods so that the bumps can be formed efficiently.

The heat stages 21 and 22 and the transferring device 30 will be described in further detail below with reference to FIGS. 6(a) to 11(b).

Referring to FIGS. 6(a) to 9(b), each of the heat stages 21 and 22 has embedded therein a plurality of lifting pins 25 that are protrudable from an upper surface 24a of the stage body 24 holding a wafer 2. Above the upper surface 24a of the stage body 24 is provided two positioning pins 28 protruding from the upper surface 24a and a pair of clamp arms 26.

Referring to FIGS. 5(a)-5(c), when a main body 31 of the transferring device 30 is located at any of the positions 30a to 30d facing the wafer magazines 12 and 14 and heat stages 21 and 22, the arm 32 holding a wafer 2 advances from the main body 31 towards the corresponding one of the wafer magazines 12 and 14 and heat stages 21 and 22, or recedes from the corresponding one.

An operation performed when the transferring device 30 places a wafer 2 on the upper surface 24a of the stage body 24 of the heat stage 21 or 22 will be described below with reference to FIGS. 6 to 9.

Figure 6A:
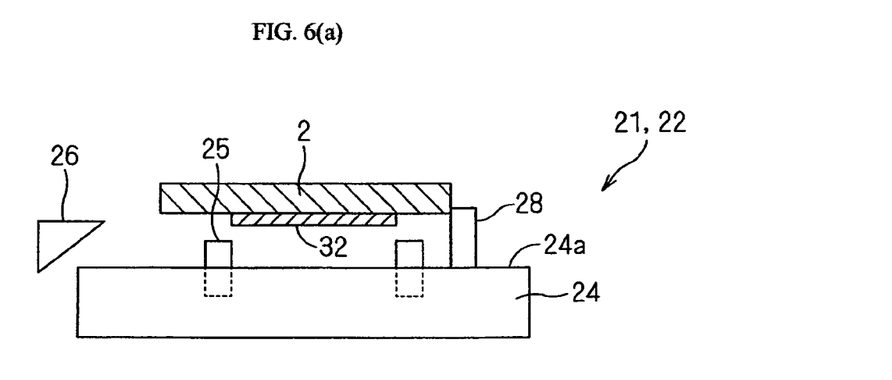
FIGS. 6(a)-6(b) illustrate a wafer transferring process (embodiment).
Figure 6B:
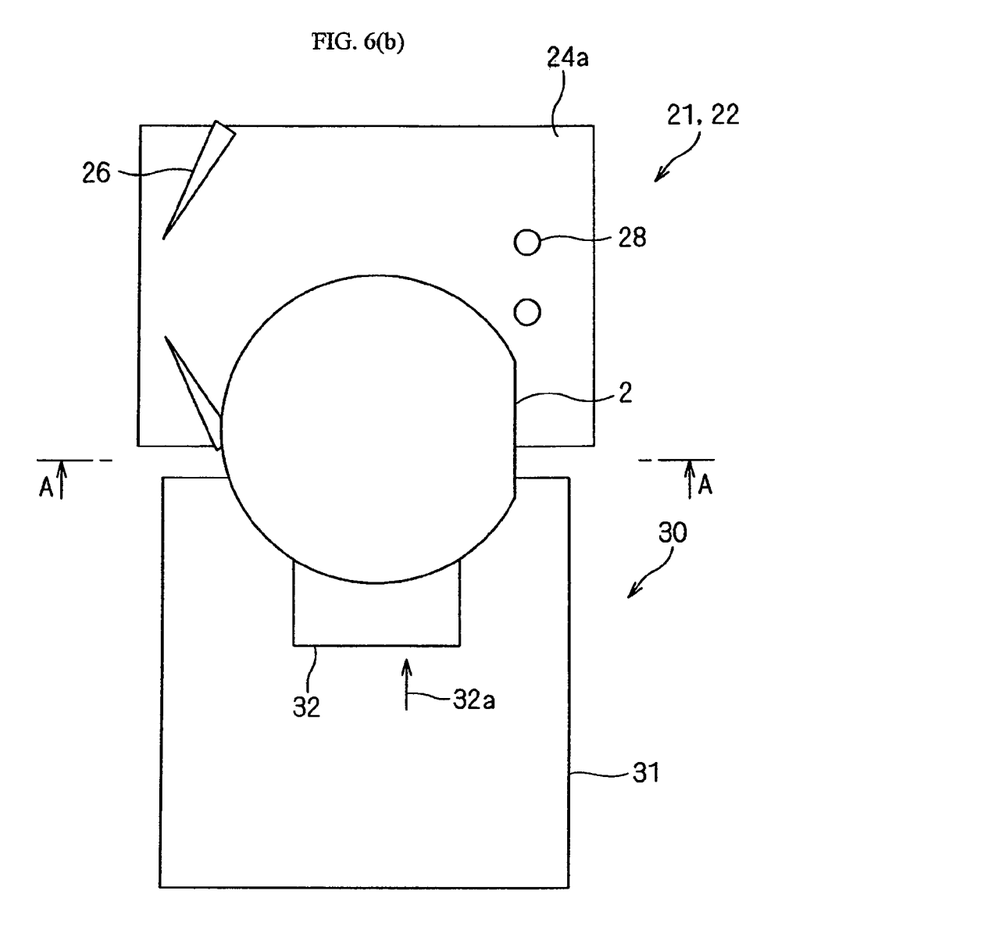

While holding a wafer 2, the arm 32 of the transferring device 30 advances towards the heat stage 21 or 22, as shown with an arrow 32a in FIG. 6(b). At this time, the pair of clamp arms 26 is in an open state. In other words, the tip ends of the clamp arms 26 are withdrawn from a position on the upper surface 24a of the stage body 24 of the heat stage 21 or 22 where the wafer 2 is to be placed.

Figure 7A:
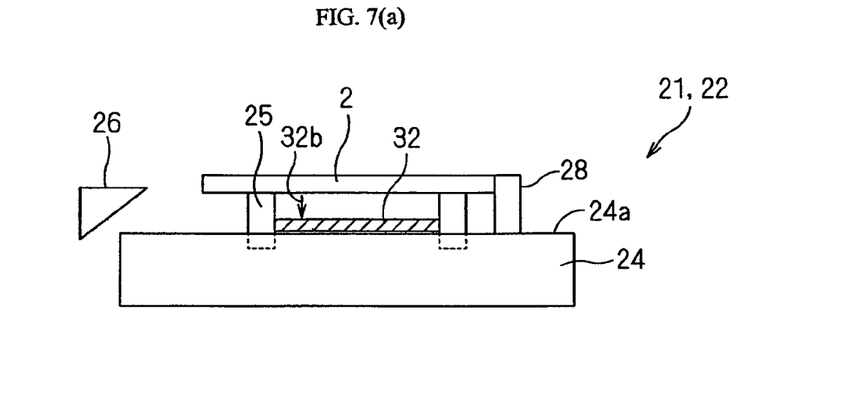
FIGS. 7(a)-7(b) also illustrate the wafer transferring process (embodiment).
Figure 7B:
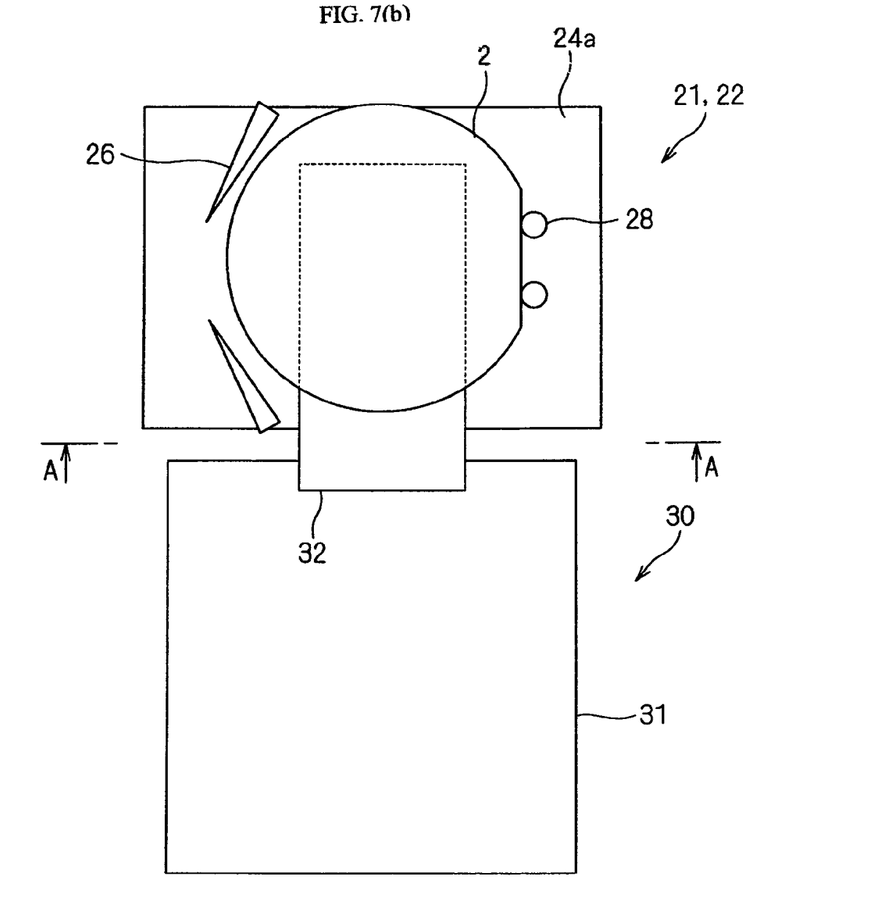

When the arm 32 of the transferring device 30 transfers the wafer 2 onto the stage body 24 (more specifically, above the lifting pins 25), the arm 32 descends as shown with an arrow 32b in FIG. 7 so as to be replaced by the lifting pins 25 for the supporting of the wafer 2. In other words, the wafer 2 is supported at the upper ends of the lifting pins 25.

Figure 8A:
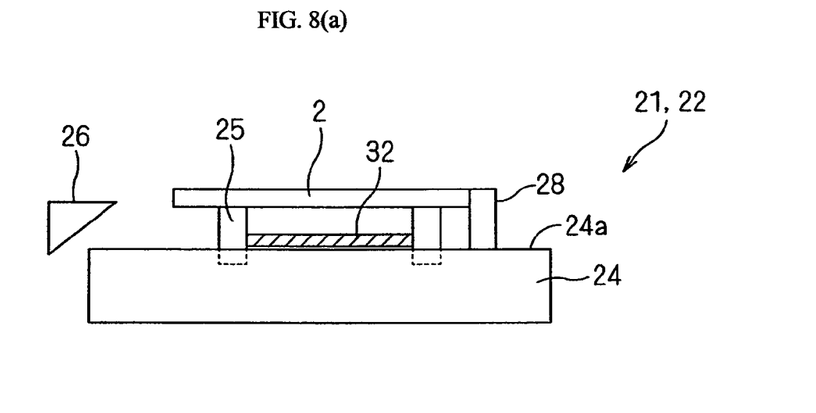
FIGS. 8(a)-8(b) also illustrate the wafer transferring process (embodiment).
Figure 8B:
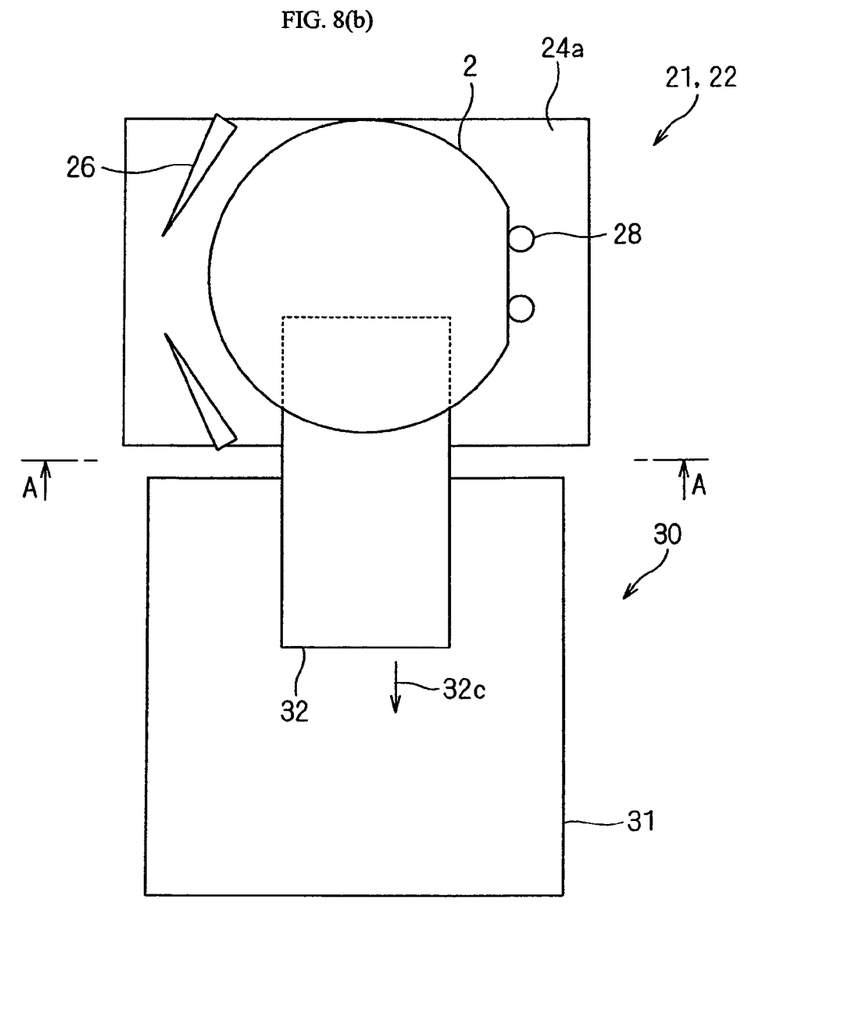

Subsequently, the arm 32 of the transferring device 30 remaining in the descent state recedes toward the main body 31 as shown with an arrow 32c in FIG. 8.

Figure 9A:
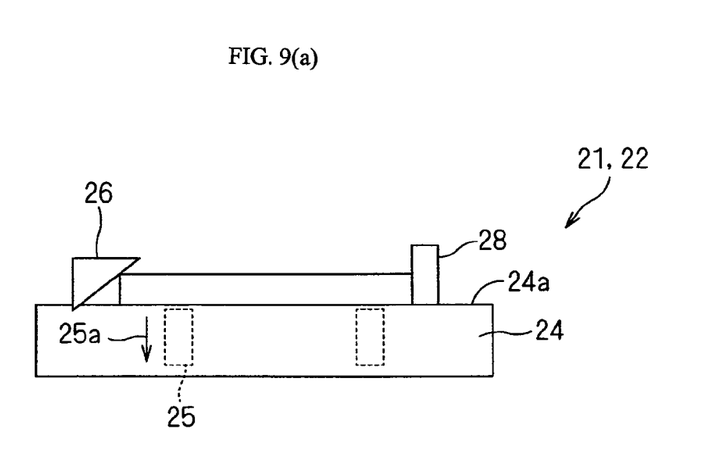
FIGS. 9(a)-9(b) also illustrate the wafer transferring process (embodiment).
Figure 9B:
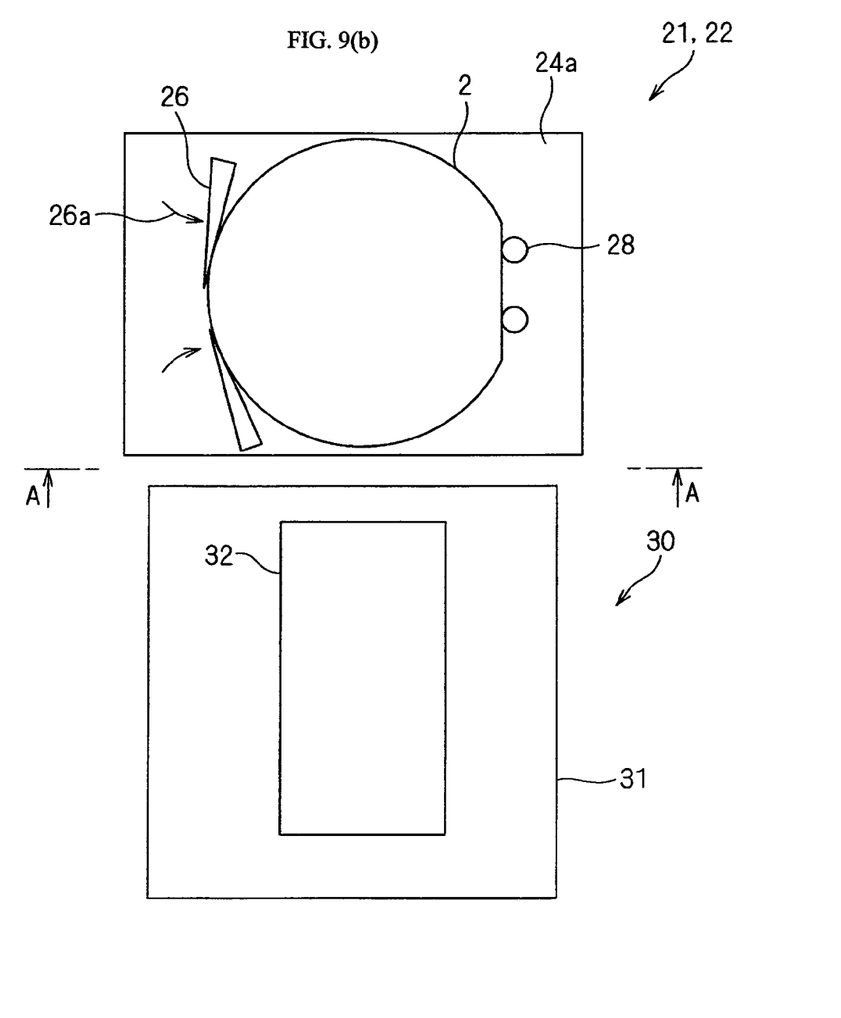

Then, the lifting pins 25 supporting the wafer 2 descend as shown with an arrow 25a in FIG. 9, so that the wafer 2 becomes placed on the upper surface 24a of the stage body 24. Next, the clamp arms 26 rotate as shown with arrows 26a so as to become in a closed state. In this state, the tip ends of the clamp arms 26 are in contact with one side of the wafer 2 (left side in the drawings) so as to bias the wafer 2 toward the positioning pins 28. Consequently, the other side of the wafer 2 (right side in the drawings) is brought into contact with the positioning pins 28, whereby the wafer 2 is positioned. In this state, the wafer 2 is sandwiched between the clamp arms 26 and the positioning pins 28.

The contact sections between the clamp arms 26 and the wafer 2 may be sections located at a side substantially opposite to the positioning pins 28, namely, to the left of the center assuming that the wafer 2 has a circular shape without an orientation flat portion, and where a bias force in the right direction (towards the positioning pins 28) is produced in the state where the clamp arms 26 are closed.

Figure 10:
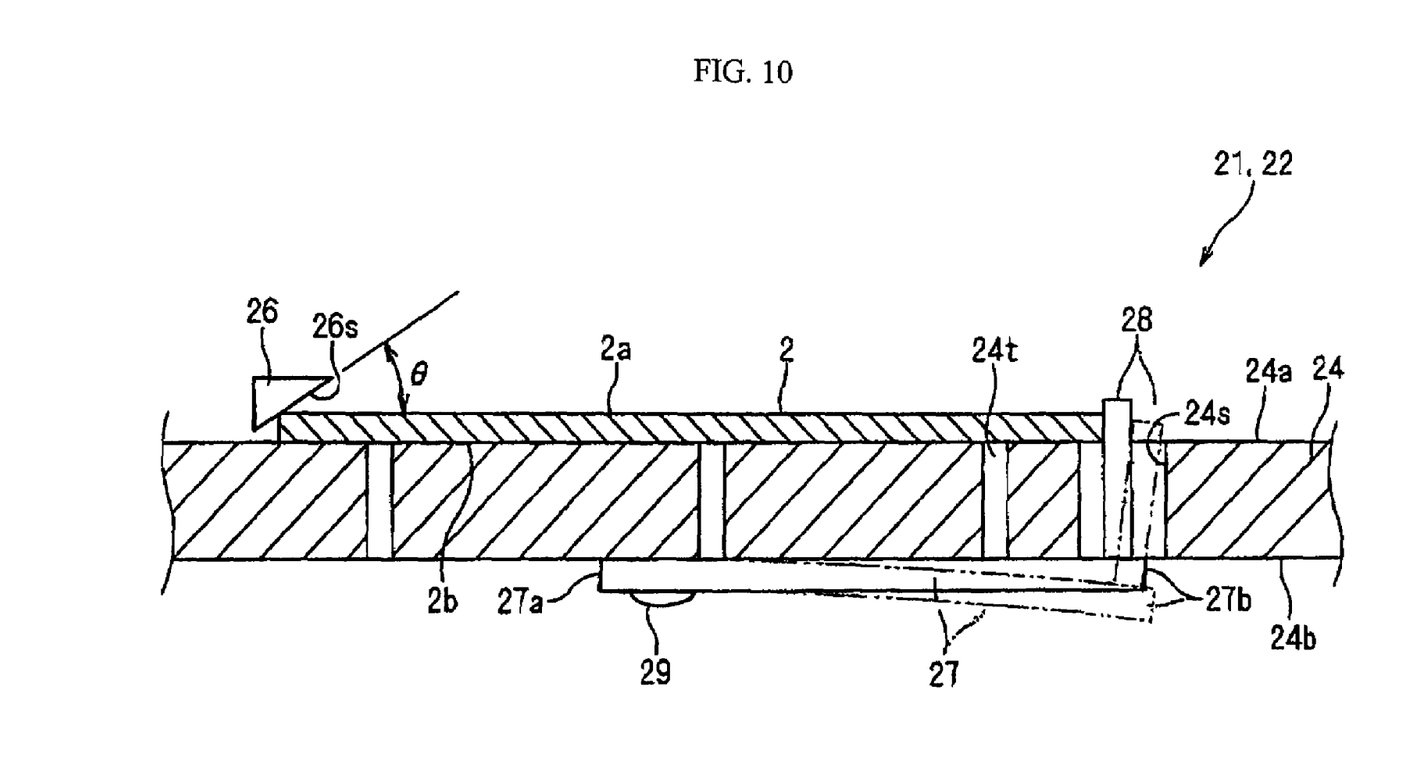
FIG. 10 is a cross-sectional view of a stage (embodiment).

The structure of the heat stages 21 and 22 will now be described with reference to a cross-sectional view in FIG. 10.

A wafer 2 is positioned at a position where the center of the wafer 2 and the center of the stage body 24 substantially coincide with each other. The wafer 2 and the stage body 24 thermally expand outward from their centers. Therefore, if the positioning pins 28 have a fixed structure, a difference in the amount of displacement caused by different coefficients of thermal expansion between the stage body 24 and the wafer 2 cannot be absorbed, resulting in an excessive force to be imparted to sections of the wafer 2 that are in contact with the pins. This can lead to damaging of the wafer 2, such as formation of cracks.

To prevent this, the positioning pins 28 are supported with leaf springs 27. By resilient deformation, the leaf springs 27 absorb the difference in the amount of displacement caused by different coefficients of thermal expansion between the stage body 24 and the wafer 2, thereby preventing an excessive force from being imparted to the wafer 2.

The leaf springs 27 are disposed on a lower surface 24b of the stage body 24 of each heat stage 21 or 22. One end 27a of each leaf spring 27 is fixed to the lower surface 24b of the stage body 24 with a screw 29. A base end of each positioning pin 28 is fixed to the other end 27b of the corresponding leaf spring 27. The positioning pins 28 are loosely fitted in through holes 24s provided in the stage body 24 and protrude upward from the upper surface 24a of the stage body 24.

When a force exceeding a predetermined magnitude is imparted rightward to the tip ends of the positioning pins 28, the leaf springs 27 bend downward in the form of an arc as shown with a chain line in the drawing, causing the positioning pins 28 to move rightward. Thus, the difference in the amount of displacement caused by different coefficients of thermal expansion between the stage body 24 and the wafer 2 is absorbed, thereby preventing the positioning pins 28 from imparting an excessive force to the wafer 2.

On the other hand, with regard to the clamp arms 26 biasing the wafer 2, the wafer 2 is biased by means of a spring force to be described hereinafter in detail, thereby preventing the clamp arms 26 from imparting an excessive force to the wafer 2.

The tip end of each clamp arm 26 has a contact surface 26s that is contactable with an outer periphery of the wafer 2. The contact surface 26s is inclined at a predetermined angle θ (0°<θ<90°) with respect to the upper surface 24a of the stage body 24 and substantially faces the upper surface 24a of the stage body 24.

In each clamp arm 26, at least the contact surface 26s has electrical conductivity, and the contact surface 26s is grounded. When the clamp arms 26 close, the contact surfaces 26s of the clamp arms 26 come into contact with a ground electrode provided in an outer periphery area of the wafer 2. Consequently, the contact surfaces 26s remove an electric charge from the wafer 2, which is generated when the wafer 2 at room temperature having pyroelectric properties being placed on the heat stage 21 or 22 undergoes a temperature change. Due to being inclined, the contact surfaces 26s can properly come into contact with the ground electrode of the wafer 2, thereby ensuring the removal of electric charge from the wafer 2.

When the clamp arms 26 are being closed, the contact surfaces 26s move substantially in parallel towards the positioning pins 28 so as to come into contact with the outer periphery area of the wafer 2. In this case, the wafer 2 receives a force component parallel to the upper surface 24a of the stage body 24 and a downward force component orthogonal to the upper surface 24a of the stage body 24. Because the wafer 2 is pressed against the upper surface 24a of the stage body 24 by the downward force component, the wafer 2 is prevented from floating upward from the upper surface 24a of the stage body 24 even though the positioning pins 28 become tilted as shown with the chain line.

The stage body 24 is provided with air holes 24t. With air drawn in through the air holes 24t, a lower surface 2b of the wafer 2 placed on the upper surface 24a can be held thereon by suction. By allowing air to flow into between the upper surface 24a and the lower surface 2b of the wafer 2 from the air holes 24t, the wafer 2 can be readily made to float and move above the upper surface 24a during the positioning of the wafer 2, or the wafer 2 can be cooled after the bump forming process.

Figure 11A:
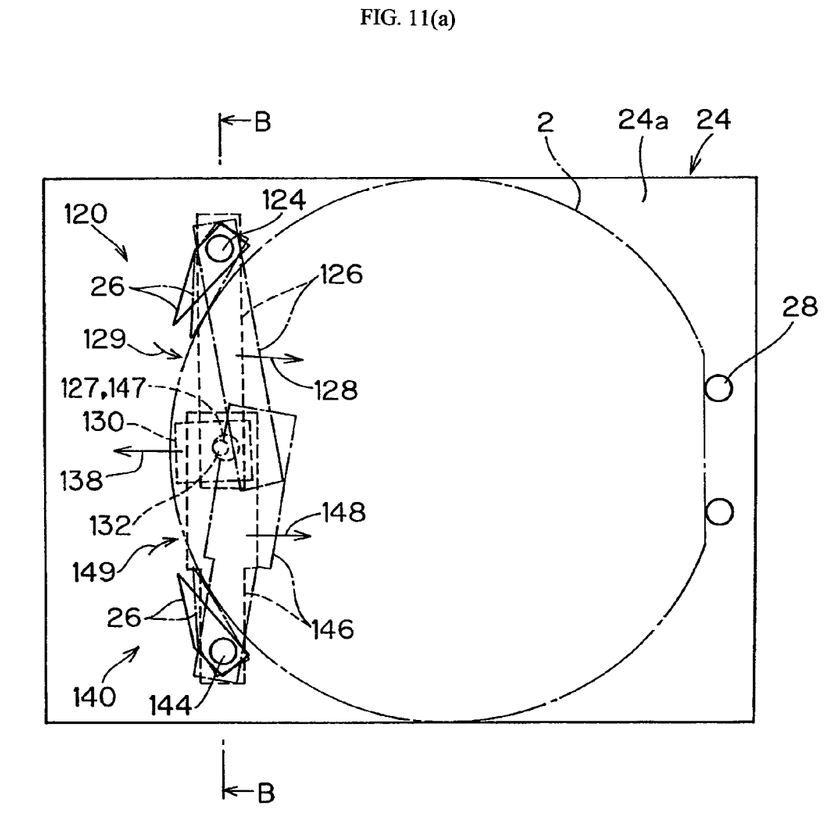
FIGS. 11(a)-11(b) include a plan view FIG. 11(a) and a cross-sectional view FIG. 11(b) of the stage (embodiment).
Figure 11B:
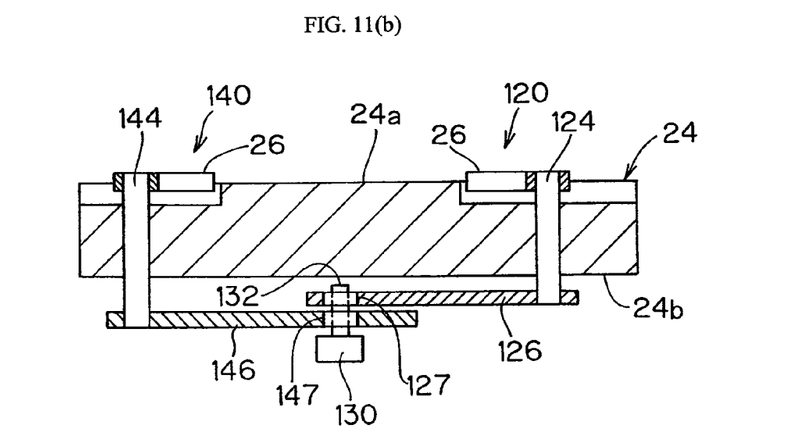

Next, opening-closing mechanisms 120 and 140 for the clamp arms 26 will be described with reference to FIGS. 11(a) and 11(b). FIG. 11(a) is a plan view. FIG. 11(b) is a cross-sectional view taken along line B-B in FIG. 11(a).

The opening-closing mechanisms 120 and 140 for the pair of clamp arms 26 respectively have rotary shafts 124 and 144 that extend through and are rotatably supported by the stage body 24 of the heat stage 21 or 22. The base ends of the clamp arms 26 are fixed to upper ends of the respective rotary shafts 124 and 144. Lower ends of the rotary shafts 124 and 144 respectively have first ends of interlocking plates 126 and 146 fixed thereto. Second ends of the interlocking plates 126 and 146 overlap each other with a gap therebetween as shown in FIG. 11(b), and respectively have through holes 127 and 147 at the overlapping sections. An engagement pin 132 projecting upward from a base member 130 is loosely fitted in these through holes 127 and 147. Extension springs (not shown) have first ends secured to the lower surface of the stage body 24 and second ends secured to the interlocking plates 126 and 146. With a spring force of these extension springs, the interlocking plates 126 and 146 are biased in a direction indicated by arrows 128 and 148 in FIG. 11(a). By being driven by an actuator, such as an extension cylinder (not shown), the base member 130 having the engagement pin 132 projecting therefrom rotates the interlocking plates 126 and 146 in a releasable manner in a direction indicated by an arrow 138 against the spring force of the extension springs acting in the direction of the arrows 128 and 148.

When the wafer 2 is to be detached from the upper surface 24a of the stage body 24 of the heat stage 21 or 22, the base member 130 moves in the direction of the arrow 138 so that the interlocking plates 126 and 146 overlap each other in a straight line, as shown with a chain line. Consequently, the clamp arms 26 become in an open state where the tip ends of the clamp arms 26 are distant from the wafer 2, as shown with a solid line.

When the wafer 2 is to be held on the upper surface 24a of the stage body 24 of the heat stage 21 or 22, the driving of the actuator moving the base member 130 is cancelled, so that the spring force of the extension springs acting in the direction of the arrows 128 and 148 causes the interlocking plates 126 and 146 to rotate as shown with the chain line. The rotation of the interlocking plates 126 and 146 induces rotation the clamp arms 26, whereby the clamp arms 26 become in a closed state where the tip ends of the clamp arms 26 are in contact with the outer periphery of the wafer 2.

FIRST EMBODIMENT

The temperature of each of the heat stages 21 and 22 is set at 70° to 90° C. when a wafer 2 is not placed thereon, and at 100° to 130° C. when a wafer 2 is placed thereon.

Although the material used for the leaf springs 27 provided on each of the heat stages 21 and 22 is SUS304, and the material used for the positioning pins 28 and the clamp arms 26 is carbon steel, such as S50C, other alternative materials having electrical conductivity may be used.

Positioning of a wafer 2 on the upper surface 24a of the stage body 24 of the heat stage 21 or 22 is implemented by closing the clamp arms 26 so that an orientation flat side comes into contact with the two positioning pins 28. In this case, the positioning pins 28 in contact with the orientation flat side of the wafer 2 are designed such that they are substantially prevented from being tilted or shifted, that is, the leaf springs 27 are substantially prevented from being bent, in response to the bias force of the clamp arms 26. Accordingly, this allows for proper positioning of the wafer 2.

Instead of such a design, the leaf springs 27 may be locked by means of, for example, a cylinder to prevent the positioning pins 28 from being tilted or shifted vertically when the wafer 2 is being positioned by closing the clamp arms 26 and bringing the orientation flat side of the wafer 2 into contact with the positioning pins 28. In that case, the lock may be released when the temperature of the stage increases.

In each clamp arm 26, at least the contact surface 26s has electrical conductivity, and the contact surface 26s is grounded. When the clamp arms 26 close while a wafer 2 is placed on the heat stage 21 or 22, the contact surfaces 26s of the clamp arms 26 come into contact with the ground electrode provided in the outer periphery area of the wafer 2. Consequently, the contact surfaces 26s can remove an electric charge from the wafer 2, which is generated when the wafer 2 at room temperature having pyroelectric properties being placed on the heat stage 21 or 22 undergoes an increase or decrease in temperature.

In a case where a wafer 2 is configured such that a pyroelectric charge is unlikely to be generated, it may be preferable to shorten the time period required for lowering the temperature of the wafer 2 after the bump forming process. Specifically, this can be achieved by lifting the wafer 2 upward with the lifting pins 25 having electrical conductivity so that the lower surface of the wafer 2 is moved apart from the upper surface 24a of the stage body 24.

SECOND EMBODIMENT

In place of the leaf springs 27, a resiliently deformable member having a bimetallic structure is used. In detail, a resiliently deformable member having a bimetallic structure is formed of upper and lower layers of metallic materials having different coefficients of thermal expansion that are bonded to each other.

Thus, the resiliently deformable member having the bimetallic structure bends voluntarily as the temperature of the wafer 2 increases, so as to cause the clamp arms 26 to move away from the wafer 2. This can prevent an excessive force from being imparted to the wafer 2.

THIRD EMBODIMENT

In addition to bump forming apparatuses, the stage configuration according to the first or second embodiment can be used in other apparatuses that are for processing wafers composed of a pyroelectric material and involve processes that induce a temperature change in the material.

For example, the stage configuration according to the first or second embodiment can be used in (a) an apparatus having a stage that measures the characteristics of a wafer during an aging process or after an aging process, (b) an apparatus having a stage that performs thermo-compression bonding on a chip at a wafer level under high temperature, and (c) an apparatus having a stage that performs ultrasonic bonding in combination with thermo-compression bonding on a chip at a wafer level under high temperature.

CONCLUSION

As described above, the clamp arms 26 and the positioning pins 28 are given resilient characteristics so that a difference in the amount of displacement between the stage body 24 and the wafer 2 caused by thermal expansion can be absorbed. Accordingly, this can prevent damaging of the wafer 2, such as formation of cracks. In addition, the use of the clamp arms 26 having the inclined contact surfaces 26s significantly enhances the reliability for removing an electric charge from the wafer 2 in the case where the wafer 2 has pyroelectric properties.

The present invention is not limited to the above embodiments, and various modifications are permissible.

Although particular embodiments have been described, many other variations and modifications and other uses will become apparent to those skilled in the art. Therefore, the present invention is not limited by the specific disclosure herein.

What is claimed is:

1. A positioning stage comprising:
   a wafer-holding surface for receiving a wafer;
   a positioning member that is disposed adjacent to the wafer-holding surface and at a predetermined position with respect to the wafer-holding surface; and
   a biasing member that is disposed for contacting a wafer placed on the wafer-holding surface so as to resiliently bias the wafer towards the positioning member, and wherein the biasing member has electrical conductivity in at least the contact surface;
   wherein the biasing member has a contact surface that substantially faces the wafer-holding surface at an angle between 0° and 90°, the contact surface being disposed for contacting an outer peripheral area of the wafer placed on the wafer-holding surface so as to bias the wafer towards the wafer-holding surface in a slantwise direction corresponding to said angle.

2. A positioning stage according to claim 1, comprising:
   wherein the positioning member extends substantially orthogonal to the wafer-holding surface,
   wherein the positioning stage includes a resiliently deformable member that brings the positioning member into contact with a wafer placed on the wafer-holding surface and holds the positioning member at a predetermined position corresponding to a predetermined position of the wafer, and
   wherein when a bias force exceeding a predetermined magnitude is imparted to the positioning member in a direction substantially away from the wafer placed on the wafer-holding surface, the resiliently deformable member becomes resiliently deformed so as to allow the positioning member to recede from the positioning position towards said direction substantially away from the wafer placed on the wafer-holding surface.

3. A positioning stage according to claim 2, wherein said wafer comprises a pyroelectric material, and wherein an electric charge on the wafer is removed through the electrical conductivity of the contact surface of the biasing member.

4. A positioning stage according to claim 1, wherein said wafer comprises a pyroelectric material, and wherein an electric charge on the wafer is removed through the electrical conductivity of the contact surface of the biasing member.

5. A positioning stage comprising:
   a wafer-holding surface for receiving a wafer; and
   a positioning member that is disposed adjacent to the wafer-holding surface and that extends substantially orthogonal to the wafer-holding surface,
   a biasing member that is disposed for contacting a wafer placed on the wafer-holding surface so as to resiliently bias the wafer towards the positioning member, the biasing member having a contact surface disposed for contacting an outer peripheral area of the wafer, wherein the biasing member has electrical conductivity in at least the contact surface,
   wherein the positioning stage includes a resiliently deformable member that brings the positioning member into contact with a wafer placed on the wafer-holding surface and holds the positioning member at a predetermined position corresponding to a predetermined position of the wafer, and
   wherein when a bias force exceeding a predetermined magnitude is imparted by the biasing member to the positioning member in a direction substantially away from the wafer placed on the wafer-holding surface, the resiliently deformable member becomes resiliently deformed so as to allow the positioning member to recede from the positioning position towards said direction substantially away from the wafer placed on the wafer-holding surface.

6. A positioning stage according to claim 5, wherein said resiliently deformable member comprises a leaf spring connected to said positioning member.

7. A positioning stage according to claim 5, wherein said wafer comprises a pyroelectric material, and wherein an electric charge on the wafer is removed through the electrical conductivity of the contact surface of the biasing member.

8. A bump forming apparatus comprising:
   two or more positioning stages, each positioning stage comprising:
   a wafer-holding surface for receiving a wafer;
   a positioning member that is disposed adjacent to the wafer-holding surface and at a predetermined position with respect to the wafer-holding surface; and
   a biasing member that is disposed for contacting a wafer placed on the wafer-holding surface so as to resiliently bias the wafer towards the positioning member,
   wherein the biasing member has a contact surface that substantially faces the wafer-holding surface at an angle between 0° and 90°, the contact surface being disposed for contacting an outer peripheral area of the wafer placed on the wafer-holding surface so as to bias the wafer towards the wafer-holding surface in a slantwise direction corresponding to said angle;
   heating means for heating wafers placed on the wafer-holding surfaces of the stages; and
   stage shifting means for shifting each stage between a bump forming position facing a bonding device and a withdrawn position withdrawn from the bump forming position,
   wherein the stage shifting means sequentially shifts the stages to the bump forming position and to the withdrawn position,
   wherein the bonding device forms a bump on a wafer placed on the wafer-holding surface of one of the stages positioned at the bump forming position, while a wafer already having a bump formed thereon, placed on the wafer-holding surface of another stage positioned at the withdrawn position, is removed from the wafer-holding surface of said other stage, such that the wafer-holding surface of said other stage becomes available for receiving and heating a subsequent wafer which is next to have a bump formed thereon, while said bump is still being formed at said bump-forming position.

9. The apparatus according to claim 8, wherein the biasing member has electrical conductivity in at least the contact surface.

10. The apparatus according to claim 9, wherein said wafer comprises a pyroelectric material, and wherein an electric charge on the wafer is removed through the electrical conductivity of the contact surface of the biasing member.

11. The apparatus according to claim 8, comprising:
    wherein the positioning member extends substantially orthogonal to the wafer-holding surface,
    wherein the positioning stage includes a resiliently deformable member that brings the positioning member into contact with a wafer placed on the wafer-holding surface and holds the positioning member at a predetermined position corresponding to a predetermined position of the wafer, and
    wherein when a bias force exceeding a predetermined magnitude is imparted to the positioning member in a direction substantially away from the wafer placed on the wafer-holding surface, the resiliently deformable member becomes resiliently deformed so as to allow the positioning member to recede from the positioning position towards said direction substantially away from the wafer placed on the wafer-holding surface.

12. A bump forming method performed using two or more positioning stages to sequentially form bumps on wafers placed on the wafer-holding surfaces of the stages, each positioning stage comprising:

a wafer-holding surface for receiving a wafer;

a positioning member that is disposed adjacent to the wafer-holding surface and at a predetermined position with respect to the wafer-holding surface;

a biasing member that is disposed for contacting a wafer placed on the wafer-holding surface so as to resiliently bias the wafer towards the positioning member, and wherein the biasing member has a contact surface that substantially faces the wafer-holding surface at an angle between 0° and 90°, the contact surface being disposed for contacting an outer peripheral area of the wafer placed on the wafer-holding surface so as to bias the wafer towards the wafer-holding surface in a slantwise direction corresponding to said angle;

the method comprising:

a first step of disposing at least one of the stages at a bump forming position facing a bonding device while disposing at least another one of the stages at a withdrawn position withdrawn from the bump forming position;

a second step of disposing said at least one of the stages at the withdrawn position while disposing said at least another one of the stages at the bump forming position; and repeating the first step and the second step while shifting the stages, wherein the first and second steps include the steps of:

using the bonding device to form a bump on a wafer placed on the wafer-holding surface of the stage disposed at the bonding position, and removing a wafer having a bump formed thereon from the wafer-holding surface of the stage disposed at the withdrawn position, and placing a subsequent wafer to have a bump formed thereon on the wafer-holding surface of the stage and heating the wafer, while said bump is still being formed at said bump-forming position.

13. The method according to claim 12, wherein the biasing member has electrical conductivity in at least the contact surface.

14. The method according to claim 13, wherein said wafer comprises a pyroelectric material, and wherein an electric charge on the wafer is removed through the electrical conductivity of the contact surface of the biasing member.

15. The method according to claim 12, comprising:

wherein the positioning member extends substantially orthogonal to the wafer-holding surface, wherein the positioning stage includes a resiliently deformable member that brings the positioning member into contact with a wafer placed on the wafer-holding surface and holds the positioning member at a predetermined position corresponding to a predetermined position of the wafer, and wherein when a bias force exceeding a predetermined magnitude is imparted to the positioning member in a direction substantially away from the wafer placed on the wafer-holding surface, the resiliently deformable member becomes resiliently deformed so as to allow the positioning member to recede from the positioning position towards said direction substantially away from the wafer placed on the wafer-holding surface.

* * * * *